12) United States Patent
Haiut (10) Patent No.: US 11,238,887 B2
(45) Date of Patent: Feb. 1, 2022

(54) INTERFACE TO LEAKY SPIKING NEURONS (71) Applicant: DSP Group Ltd., Herzliya (IL)

(72) Inventor: Moshe Haiut, Ramat Gan (IL)

(73) Assignee: DSP GROUP LTD., Herzliya (IL)

( * ) Notice: Subject to any disclaimer, the term of this patent is extended or adjusted under 35 U.S.C. 154(b) by 889 days.

(21) Appl. No.: 16/021,147

(22) Filed: Jun. 28, 2018

(65) Prior Publication Data

US 2019/0013037 A1  Jan. 10, 2019

Related U.S. Application Data (63) Continuation-in-part of application No. 15/877,459, filed on Jan. 23, 2018, now Pat. No. 11,087,205.

(60) Provisional application No. 62/449,129, filed on Jan. 23, 2017, provisional application No. 62/530,209, filed on Jul. 9, 2017.

(51) Int. Cl.
G06N 3/04    (2006.01)
G10L 25/24   (2013.01)
H03K 7/00    (2006.01)
G10L 25/30   (2013.01)
G06N 3/063   (2006.01)

(52) U.S. Cl.
CPC .......... *G10L 25/24* (2013.01); *G06N 3/04* (2013.01); *G06N 3/049* (2013.01); *G06N 3/0481* (2013.01); *G06N 3/063* (2013.01); *G10L 25/30* (2013.01); *H03K 7/00* (2013.01); *G06F 2207/4824* (2013.01)

(58) Field of Classification Search
None
See application file for complete search history.

(56) References Cited

U.S. PATENT DOCUMENTS

2015/0146874 A1* 5/2015 Ojanpera ............... H04R 29/00
                                                    381/56
2015/0269954 A1* 9/2015 Ryan ..................... G10L 15/28
                                                    704/233

* cited by examiner

*Primary Examiner* — David R Vincent
(74) *Attorney, Agent, or Firm* — Reches Patents (57) ABSTRACT A processor, that may include at least one neural network that comprises at least one leaky spiking neuron; wherein the at least one leaky spiking neuron is configured to directly receive an input pulse density modulation (PDM) signal from a sensor; wherein the input PDM signal represents a detected signal that was detected by the sensor; and wherein the at least one neural network is configured to process the input PDM signal to provide an indication about the detected input signal.

22 Claims, 7 Drawing Sheets

INTERFACE TO LEAKY SPIKING NEURONS

CROSS REFERENCE

This application is a continuation in part of U.S. patent application Ser. No. 15/877,459 filing date Jan. 23, 2018 which in turn claims priority from US provisional patent filing date Jan. 23, 2017 Ser. No. 62/449,129. This application also claims priority from U.S. provisional patent 62/530,209, filing date Jul. 9, 2017. All patent applications are incorporated herein by reference.

BACKGROUND OF THE INVENTION

In sound processing (www.wikipedia.org), the Mel-frequency cepstrum (MFC) is a representation of the short-term power spectrum of a sound, based on a linear cosine transform of a log power spectrum on a nonlinear Mel scale of frequency.

Mel-frequency cepstral coefficients (MFCCs) are coefficients that collectively make up an MFC. They are derived from a type of cepstral representation of the audio clip (a nonlinear "spectrum-of-a-spectrum"). The difference between the cepstrum and the mel-frequency cepstrum is that in the MFC, the frequency bands are equally spaced on the mel scale, which approximates the human auditory system's response more closely than the linearly-spaced frequency bands used in the normal cepstrum. This frequency warping can allow for better representation of sound, for example, in audio compression.

MFCCs include applying complex steps such as taking a Fourier transform of (a windowed excerpt of) a signal, performing some intermediate steps and applying a discrete cosine transform on a list of mel log powers, as if it were a signal.

In Pulse density modulation (PDM) the MFCC is calculated using a pre-processing hardware stage that differs from a neural network—and is positioned between a PDM signal from a microphone and the input to a neural network.

Figure 1:
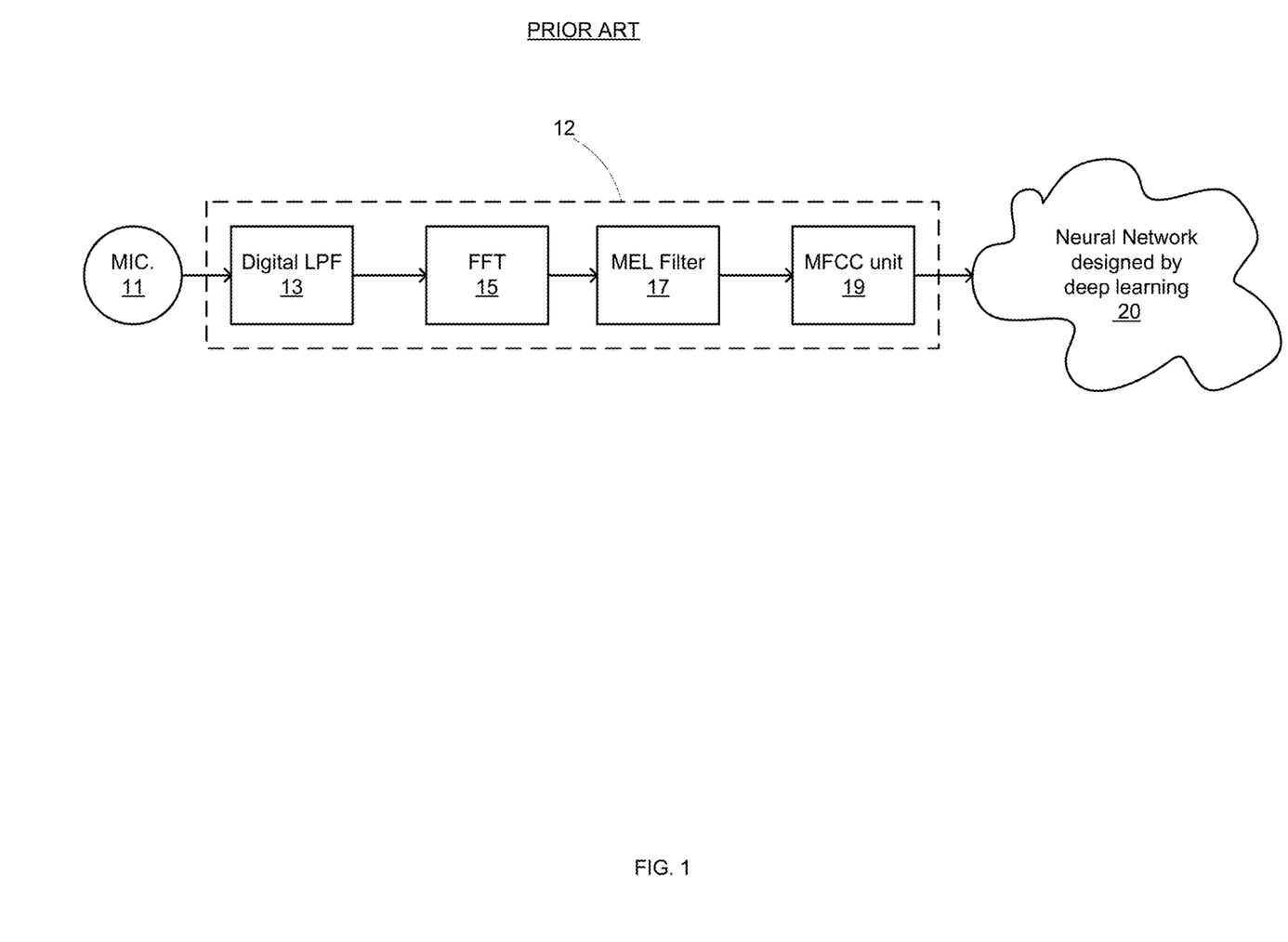
FIG. 1 illustrates a prior art circuit.

FIG. 1 illustrates a prior art pre-processing hardware stage 12 between the microphone 11 and a neural network that was designed by deep-learning 20.

The microphone PDM signal is first converted to PCM by a digital Low-Pass-Filter (digital LPF) 13 and also down-sampled to a sampling-rate that is appropriate to voice processing (typically 8-16 KSamp/sec).

The PCM samples are then buffered into about 30 ms frames and converted to the frequency domain via fast Fourier transform unit (FFT) 15. The FFT data is then converted to MEL-filters representation by MEL filters 17 and finally converted to MFCC coefficients by MFCC unit 19. The MFCC coefficients are used as the input to the neural network.

Figure 2:
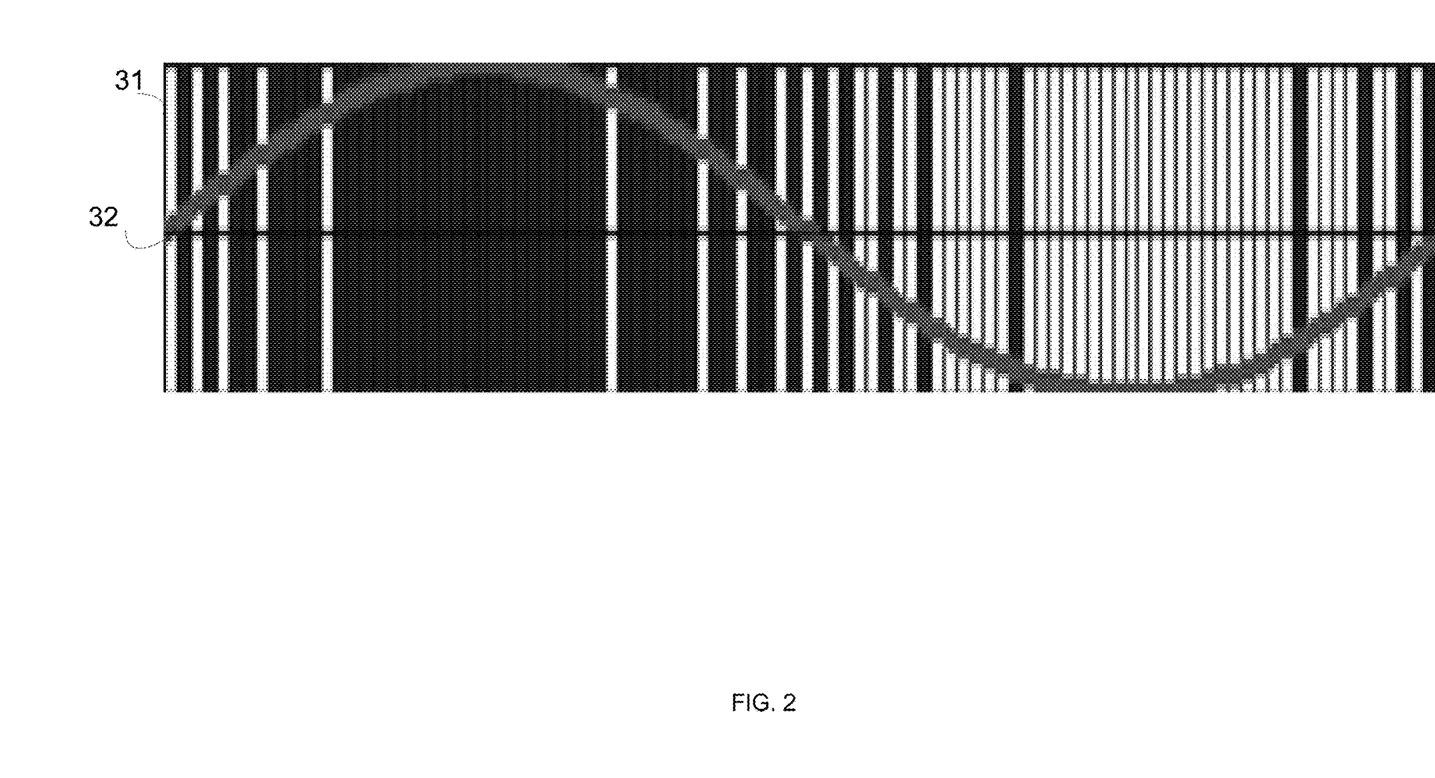
FIG. 2 illustrates a prior art analog sound signal and series of pulses.

FIG. 2 illustrates an analog sound signal 32 that is converted to a series of pulses 31.

BRIEF DESCRIPTION OF THE INVENTION

The present invention will be understood and appreciated more fully from the following detailed description taken in conjunction with the drawings in which.

DETAILED DESCRIPTION OF THE INVENTION

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

All values and/or variables illustrated below (for example—sampling rate) are merely non-limiting examples of values and/or variables.

Any example in the specification is a non-limiting example.

The terms "having", "comprising", "consisting", "consisting essentially of"—and any of their derivatives—are used in an interchangeable manner. Any combination of components (such as leaky spiking neurons) may be a closed list, an open list of an almost open list of components.

There is provided a circuit that includes a direct hardware interface between a sensor and at least one neural network that is based on Pulse Density Modulation (PDM) signaling.

A non-limiting example of a sensor that uses PDM for its output signal is a digital PDM microphone.

A non-limiting example of a low power hardware implementation of a leaky spiking neural network that is based on PDM signaling is illustrated in U.S. patent application Ser. No. 15/877,459 filing date Jan. 23, 2018.

A direct hardware interface between the sensor and the neural network does not require any sort of pre-processing, conversion logic, or CODEC. Instead—the preprocessing may be executed by a NN.

Anyway, it may require an interface driver in order to match between the I/O voltage levels and I/O impedances of the two electronic elements.

The said direct hardware interface provides the following advantages:
 a. Smaller silicon area of the integrated solution.
 b. Lower power consumption of the integrated solution.
 c. A single neural network design that incorporates all the parts of the algorithm (including all pre-processing blocks for feature-extraction which never have been considered part of the neural network in previous and existing solutions).

The direct hardware interface may benefit from the fact that some of the hardware implementations of neural networks are based on spiking neurons, which means that the inter-neuron signaling inside the network—as well as the I/O interface of the individual neurons—consist of pulse trains of fixed amplitude and width. Such neural networks actually use PDM to express the temporary levels of signals that pass from one neuron to the other inside the network.

Such leaky spiking neurons should use an internal integrator to produce and maintain the temporary value of their PDM output signal. This characteristic is related to the time-axis, which makes these neurons similar to Long/Short Time Memory (LSTM).

It can be shown that if a hardware spiking neural network is designed to produce its spikes in a maximum rate that is determined by the sensor's clock frequency, then the sensor's PDM output can be treated as one of the inputs of the network. This means that one can design a neural network that not only performs its main task—which is the target of the Deep-Learning process—but also performs the auxiliary tasks of data conversion and signal feature-extraction (which are considered to be pre-processes).

The Deep-Learning process can lead to hardware implementation that is based on leaky spiking neurons (if one ignores their temporal characteristics). Such a neural network can run on a programmable low-power hardware machine that is designed to emulate leaky spiking neurons. The same hardware machine can then be programmed to also execute fuzzy-logic that replaces the pre-process job, using a library design that is purely made out of leaky spiking neurons. Accordingly—no additional dedicated hardware is needed for converting the PDM samples into PCM samples and producing an approximation of MEL coefficients. The pre-process spiking neural network directly receives the PDM pulses from the microphone and treats them as input spikes (e.g. at 1.5 MHz spikes rate).

The pre-process spiking neural network produces an approximation of Mel coefficients at its outputs, and these are sampled in the low rate of 3,000 spikes/sec which is appropriate for the 100 Hz band-width of the approximation of Mel coefficients (when determined by PDM).

Using the leaky spiking neurons approach, silicon area and power consumption are reduced significantly. Also, what used to be a fixed hardware design becomes a library flexible database of a neural network that is executed by a programmable machine. Of course, the resulted an approximation of Mel coefficients may differ significantly from the precisely computed Mel coefficients of the conventional pre-process, but that is the nature of fuzzy-logic design. The deep-learning part of the design is supposed to be able to adapt to the special nature of these fuzzy-logic Mel coefficients.

Figure 3:
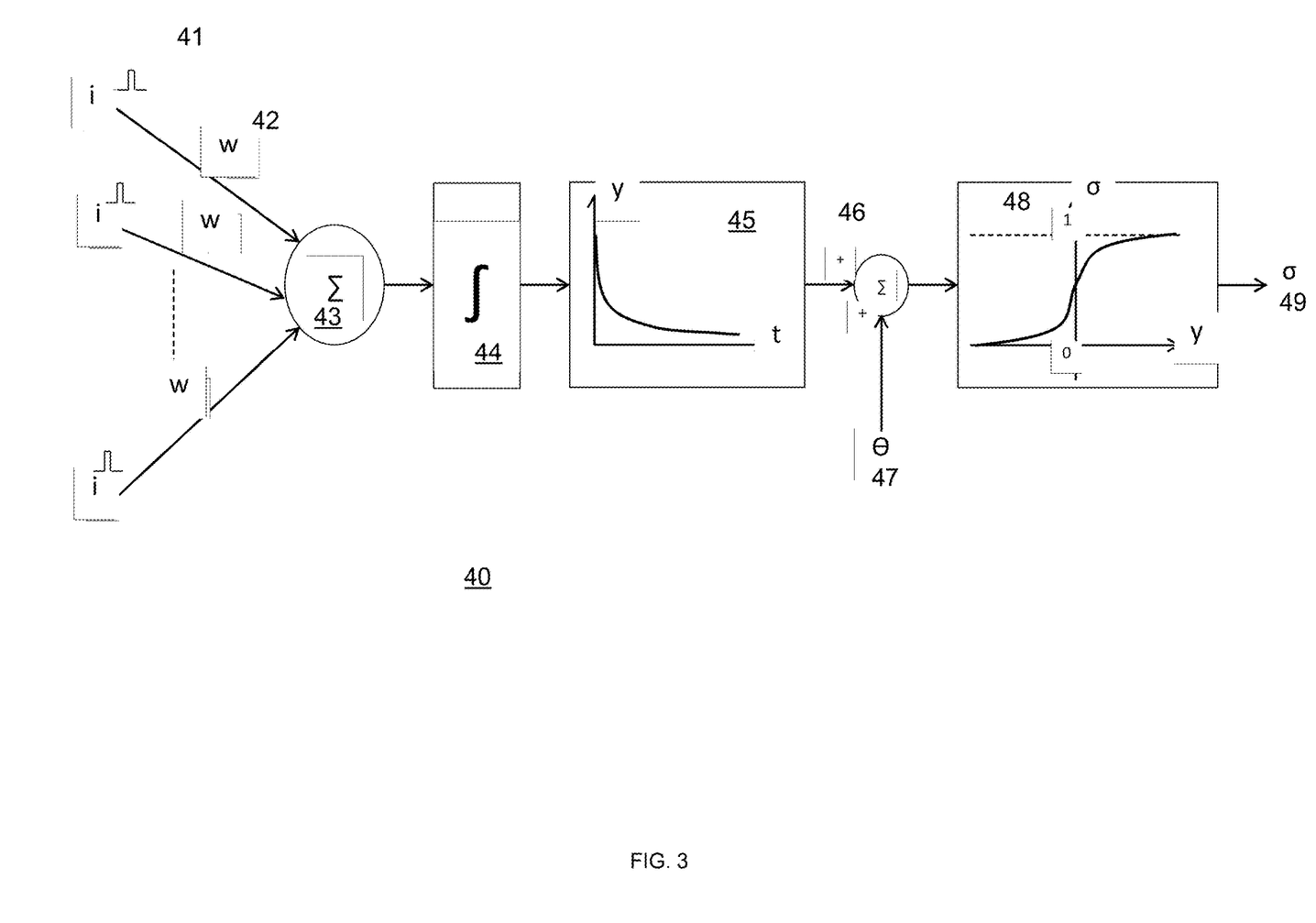
FIG. 3 illustrates an example of a leaky spiking neuron.

FIG. 3 is an example of leaky spiking neuron 40.

The leaky spiking neuron 40 may receive one or more PDM inputs 41, multiply the inputs by synapsis weights (W1 . . . Wn) 42 and add the products of the multiplications by adder 34 to provide a sum. The sum is integrated by integrator 44 to produce and maintain the temporary value of their PDM output signal.

The leaky spiking neuron may receive a single PDM input from a sensor such as microphone 11. A leaky spiking neuron may receive multiple PDM inputs from multiple sensors. The leaky spiking neuron may be included in any layer of a neural network.

The output of the integrator 44 is fed to leaky integrator 45 that has a "memory" constant alpha to provide an output that is added (adder 46) to bias theta 47 and compared by comparator 48 to a random value R that is generated by a Random Generator 24 at the end of each processing iteration. An output pulse S is generated if and only if the output of adder 18 exceeds the current random value R. The statistical characteristics of the generated random variable define the neuron activation function. In this neuron the activation function defines the average spike rate at the neuron output versus the value at the output of adder 46. For a current processing iteration (the k'th processing iteration) the leaky spiking neuron may apply the following equation: $Y_k = \text{alpha}*(Y_{k-1} + \Sigma_{j=1}^{n} Ij*Wj) + \text{theta}$ It has been found that if a hardware neural network that include leaky spiking neurons is designed to produce its spikes in a maximum rate that is determined by the sensor's clock frequency, then the sensor's PDM output can be treated as one of the inputs of the network. This means that one can design a neural network that not only performs its main task—which is the target of the Deep-Learning process—but also performs the auxiliary tasks of data conversion and signal feature-extraction (which are considered to be pre-processes).

In order to replace the pre-process that produces MFCC coefficients, an array of the leaky spiking neurons is first used to produce a vector of coefficients that approximates the output of MEL filters. This is done by utilizing the built-in parametrized time-constant feature of the firing neuron to build-up a set of resonators with central frequencies that can be tuned.

The central frequencies may be selected in various manners. For example—the central frequencies may correspond to the central frequencies of triangular overlapping windows that are used during the calculation of the MFCCs. Any other central frequencies may be used.

It is assumed that there are twenty central frequencies—but other numbers of a central frequencies may be used.

Figure 4:
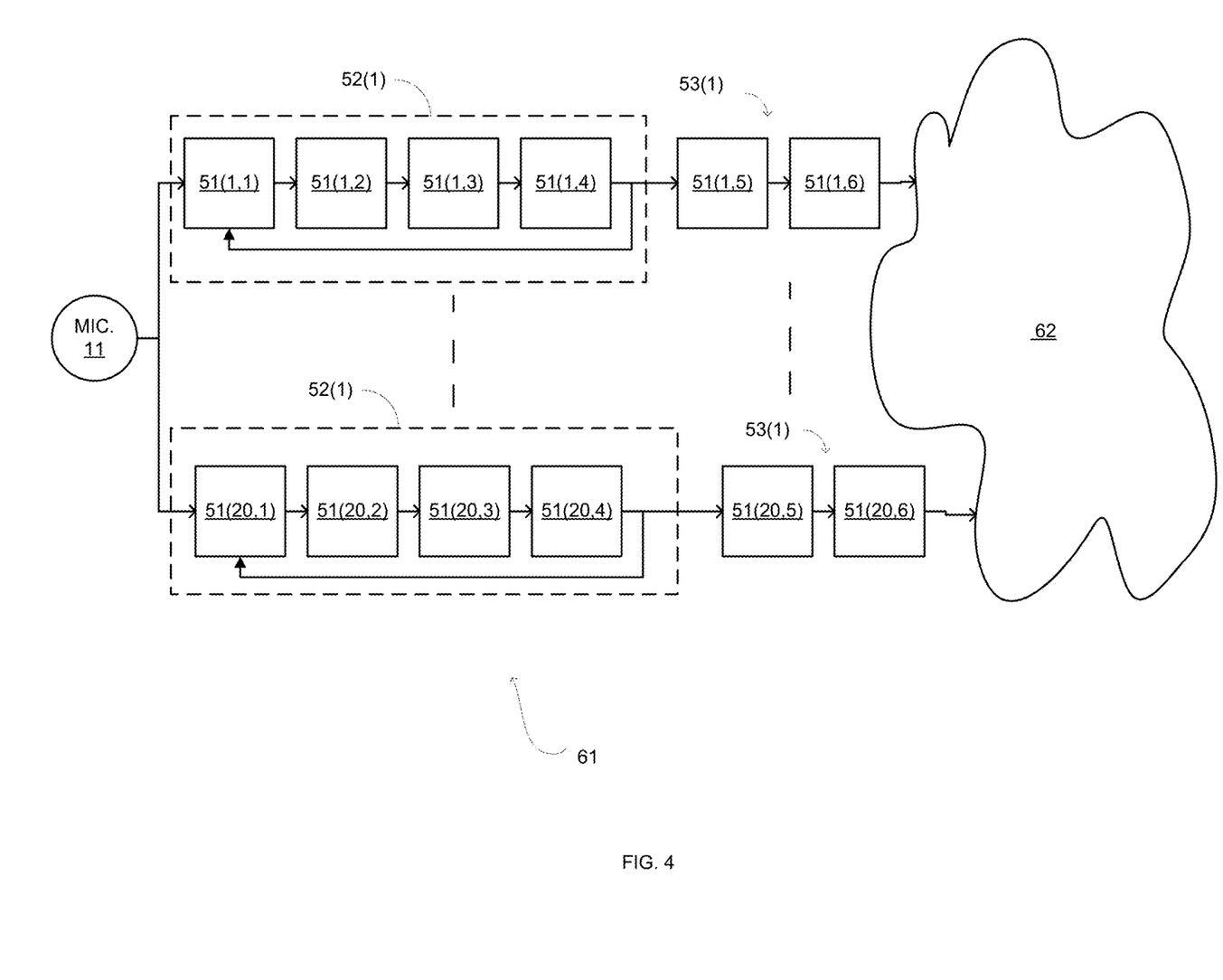
FIG. 4 illustrates an example of a microphone and leaky spiking neurons.

FIG. 4 illustrates a sensor such as a microphone (MIC) 11 that is directly coupled (without any intermediate circuit) in parallel to twenty resonators—each resonator includes a leaky spiking neurons and outputs an approximation of an output signal of a Mel filter. The approximation represent the detected signal.

The leaky spiking neurons of the twenty resonators form a first group 61 of leaky spiking neurons that outputs approximations of output signals of a bank of Mel filters, the approximations represent the detected signal from microphone 11.

FIG. 4 illustrates a first resonator that includes a loop 52(1) of first till fourth leaky spiking neurons 51(1,1), 51(1,2), 51(1,3) and 51(1,4) that are followed by peak detector 53(1) that includes fifth leaky spiking neuron 51(1, 5) and a sixth leaky spiking neuron 51(1,6).

FIG. 4 also illustrates a twentieth resonator that includes a loop 52(20) of first till fourth leaky spiking neurons 51(20,1), 51(20,2), 51(20,3) and 51(20,4) that are followed by peak detector 53(20) that includes fifth leaky spiking neuron 51(20,5) and a sixth leaky spiking neuron 51(20,6).

All twenty resonators provide the approximations of output signals of a bank of Mel filters to the second group of leaky spiking neurons 62.

Different resonators are set to different central frequencies—are configured to output approximations of different Mel filters of the bank of Mel filters.

The resonators may be tunable or non-tunable.

The fifth leaky spiking neuron (51(1,5) and 51(20,5)) of each resonator functions as a diode and the sixth leaky spiking neuron (51(1,6) and 51(20,6)) of each resonator smoothes an output signal of the fifth leaky spiking neuron.

The first group 61 of leaky spiking neurons processes the PDM signal to provide an audio process result without calculating Mel-frequency cepstral coefficients.

The resonators may be tunable. The tuning may include changing parameters of leaky spiking neurons. These parameters may include, for example, a leakage factor and a leakage period.

Leakage factor—defines the integrator leakage rate and has an effect on the neuron gain and delay. The leakage factor parameter may define the number of shifts to the right that are applied to the integrator value to be subtracted from the integrator value. This happens every time that a leakage operation is executed, and may be equivalent to multiplying the integrator by the factor alpha=1.0−2(−leakage_factor). When  represents a power of—thus a**b—means a by the power of b.

Leakage period—this defines the rate of integrator leakage operation and has an effect on the neuron gain and delay. A value 0 defines a full rate, that's to say that a leakage operation is performed per every pulse cycle. A value n defines a leakage operation once every n+1 pulse cycles.

The expected leakage time constant is: Tao=pulse_cycle*2**(leakage_factor)*(1+leakage_period).

Assuming, for example, that the first resonator is used to replace a MEL filter at 364 Hz central frequency:

The loop 52(1) includes four leaky spiking neurons 51(1,1)-51(1,4) have an identity activation function.

The loop 52(1) has the following features:
a. It is fed by a PDM signal that comes from the Microphone 11 at 1,536,000 pulses/sec.
b. The network pulse cycle is 1/1.536 [us].
c. The Identity activation function I(x) is defined as: I(x) equals x is the absolute value of x is smaller than one, I(x) equals 1 when x is not smaller than one, and I(x) equals −1 when x is not bigger than −1.
d. Leaky spiking neurons 51(1,1)-51(1,4) have the same leakage time constant Tao. This time constant is tuned to produce a delay of $\pi/4$ radians of the cycle of the central frequency $F_0$ of the MEL filter. In this example the desired central frequency is $F_0$=364 Hz, resulted from leakage factor=5, and leakage period=20, which yield: Tao=($10^{-6}$/1.536)*$2^5$*(1+20)=437.5 [us].
e. The leakage time constant behaves like the time constant of a serial resistor capacitor (RC) circuit. It can be shown that a delay of $\pi/4$ of the cycle of the central frequency $F_0$ will occur if $F_0$=1/(2$\pi$Tao). Substituting Tao=437.5 us gives $F_0$=364 Hz.
f. The gain of each neuron is 0.997, so the loop gain is about 0.99, which results in 40 dB gain for an input sinusoid at $F_0$=364 Hz, where 40 dB=20 log (1+1/(1−0.99). This is caused by the negative feedback of the signal after a delay of $\pi$=4*($\pi$/4) radians.

First and sixth leaky spiking neurons 51(1,5) and 51(1,6) have an ReLU activation function f(x): f(x) is zero if x is negative and f(x) equals x is x is not negative.

Figure 5:
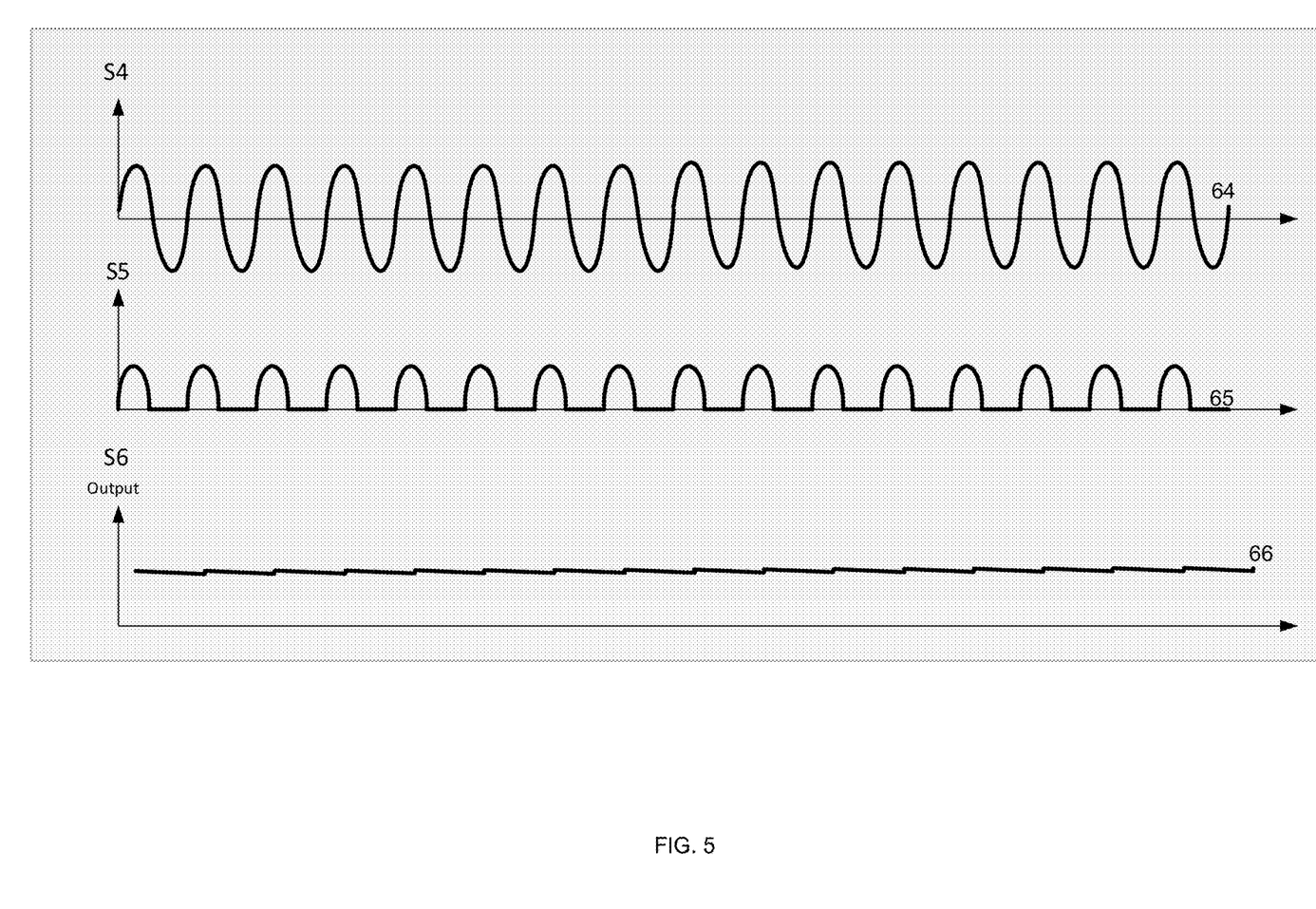
FIG. 5 illustrates an example of various signals.
Figure 6:
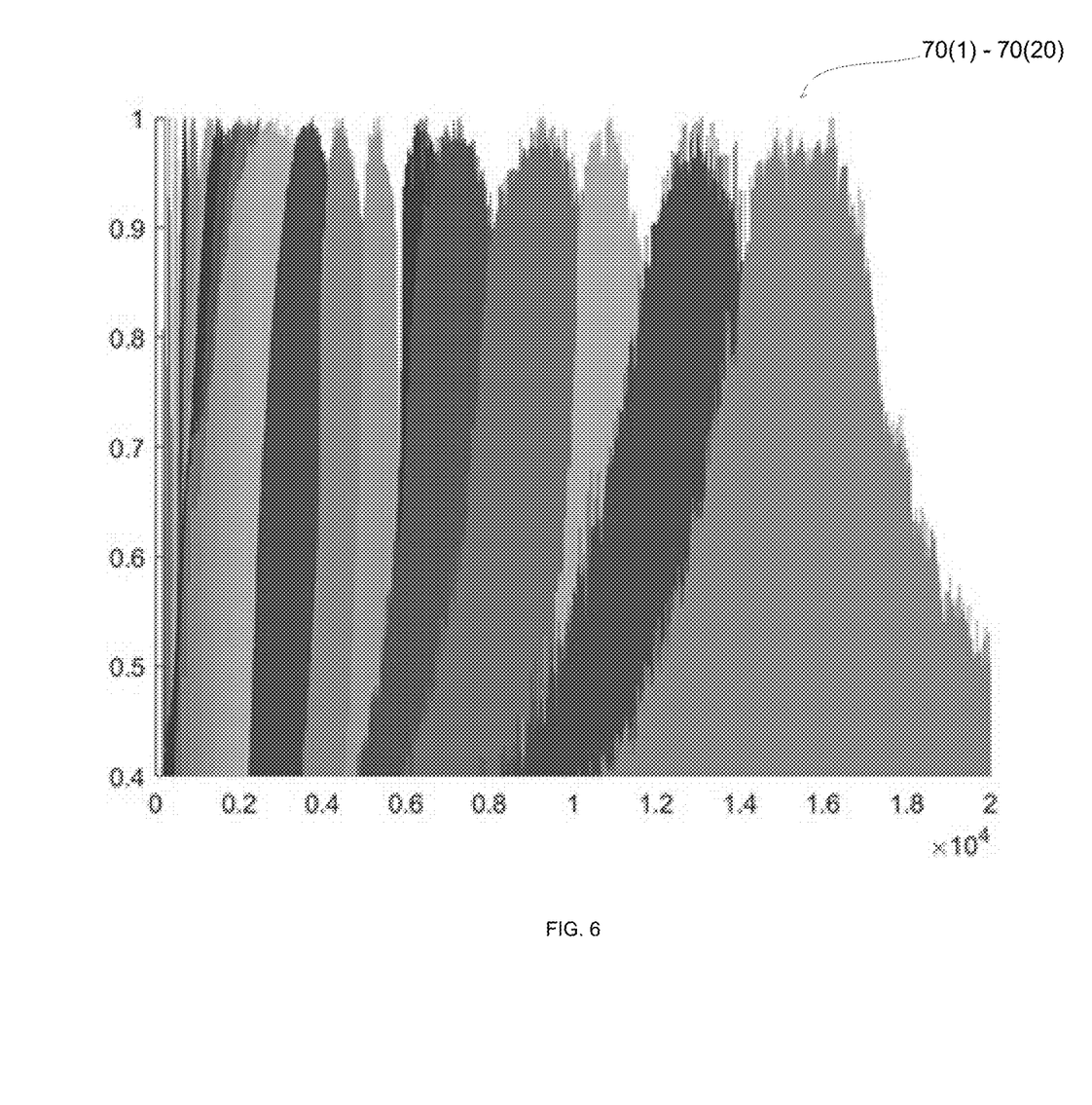
FIG. 6 illustrates an example of Mel filters.

The peak detector 53(1) has the following features:
a. The network pulse cycle is 1/1.536 [us]
b. The fifth leaky spiking neurons 51(1,5) has a leakage time constant Tao. Tao can be chosen in this example to be identical to the time constant of leaky spiking neurons 51(1,1)-51(1,4), that's to say leakage factor=5, and leakage_period=20, which yield: Tao=437.5 [us]. Tao of 51(1,15) may differ from the Tao of leaky spiking neurons 51(1,1)-51(1,4).
c. The fifth leaky spiking neuron 51(1,5) acts as a diode—it truncates the negative values of the output signal of the loop and clips the negative values to zero, so as to only leave the positive parts. In FIG. 5 signal S4 64 illustrates the output signal of the loop and the truncated signal (outputted from 51(1,5) is illustrated as S5 65.
d. The sixth leaky spiking neuron 51(1,6) smooth the output of fifth leaky spiking neuron 51(1,5), hence it has a much bigger leakage time constant Tao2. In this example leakage factor=5, and leakage period=500, which yields Tao2=($10^{-6}$/10.536)*$2^5$*(1+500)=10.43 [ms]. In FIG. 5 signal S6 66 illustrates the output signal of sixth leaky spiking neuron 51(1,6).

It was shown in this example that a resonator that includes six leaking spiking neurons may output an approximation of an output signal of a single Mel filter.

Other values of any tunable parameter of any leaky spiking neuron may be used. Other Taos and/or clock rates may be used.

A first group of leaking spiking neurons may produce twenty approximations of output signals of a filter bank of twenty Mel filters.

Figure 7:
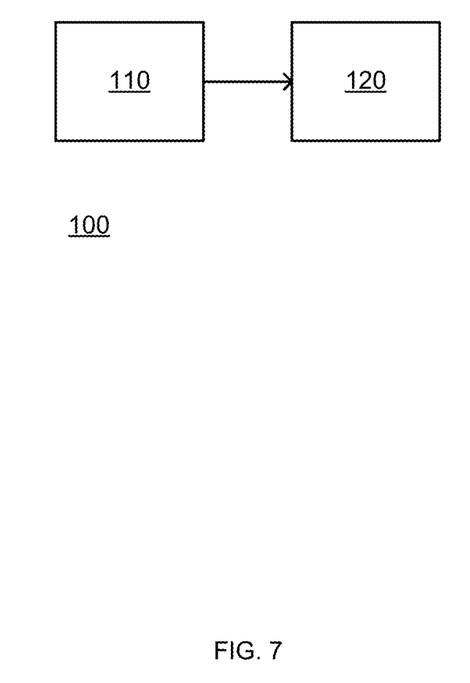
FIG. 7 illustrates an example of a method.

FIG. 7 illustrates the frequency responses 70(1)-70(20) of these twenty Mel filters.

The first and second groups of leaky spiking neurons may be included in a single neural network, in two neural networks or in more than two neural networks.

A method for configuring and/or operating any of the mentioned above circuits, neural networks may be provided.

FIG. 8 illustrates method 100.

Method 100 may be a method for signal-processing.

Method 100 may include step 110 and 120. Step 110 is followed by step 120.

Step 110 may include directly receiving, by at least one leaky spiking neuron of at least one neural network directly, an input pulse density modulation (PDM) signal from a sensor; wherein the input PDM signal represents a detected signal that was detected by the sensor.

The term "directly" means that there is no hardware pre-processing circuit between the at least one neural network and the sensor. There may be an interface driver for matching impedances between the at least one neural network and the sensor.

Step 120 may include processing, by the at least one neural network, the input PDM signal to provide an indication about the detected input signal.

The sensor may be an audio sensor and the detected signal may be an audio signal.

The at least one neural network may include a first group of leaky spiking neurons. Step 120 may include pre-processing, by the first group of leaky spiking neurons, the PDM signal to provide approximations of output signals of a bank of Mel filters, the approximations represent the detected signal.

The at least one neural network may include a second group of leaky spiking neurons that is coupled to the first group of leaky spiking neurons. Step 120 may include processing, by the second group of leaky spiking neurons, the approximations to provide an audio process result.

The first group of leaky spiking neurons may include multiple resonators Step 120 may include outputting, by different resonators, approximations of different Mel filters of the bank of MEL filters.

The multiple resonators are multiple tunable resonators.

Each resonator of the multiple resonators may include a loop of leaky spiking neurons that is followed by a peak detector.

Step 120 may include truncating to zero, by a first leaky spiking neuron of a peak detector, negative output signals of the loop; and smoothing, by a second leaky spiking neuron of the peak detector, an output signal of the first leaky spiking neuron of the peak detector.

Step 120 may include processing the PDM signal to provide an audio process result without calculating Mel-frequency cepstral coefficients.

The detected signal differs from an audio signal.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations, and alternatives are also possible. The specifications and drawings are, accordingly, to be regarded in an illustrative rather than in a restrictive sense.

The word "comprising" does not exclude the presence of other elements or steps than those listed. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe.

Thus, these terms are not necessarily intended to indicate temporal or other prioritization of such elements. The mere fact that certain measures are recited in mutually different claims does not indicate that a combination of these measures cannot be used to advantage.

I claim:

1. A processor, that comprises:
   at least one neural network that comprises at least one leaky spiking neuron; wherein the at least one leaky spiking neuron is configured to directly receive an input pulse density modulation (PDM) signal from a sensor; wherein the input PDM signal represents a detected signal that was detected by the sensor; and
   wherein the at least one neural network is configured to process the input PDM signal to provide an indication about the detected input signal.

2. The processor according to claim 1 wherein the sensor is an audio sensor and the detected signal is an audio signal.

3. The processor according to claim 2 wherein the at least one neural network comprises a first group of leaky spiking neurons that is configured to pre-process the PDM signal to provide approximations of output signals of a bank of Mel filters, the approximations represent the detected signal.

4. The processor according to claim 3 wherein the at least one neural network comprises a second group of leaky spiking neurons that is coupled to the first group of leaky spiking neurons and is configured to process the approximations to provide an audio process result.

5. The processor according to claim 3 wherein the first group of leaky spiking neurons comprises multiple resonators, wherein different resonators are configured to output approximations of different Mel filters of the bank of MEL filters.

6. The processor according to claim 5 wherein the multiple resonators are multiple tunable resonators.

7. The processor according to claim 5 wherein each resonator of the multiple resonators comprises a loop of leaky spiking neurons that is followed by a peak detector.

8. The processor according to claim 5 wherein the peak detector comprises a first leaky spiking neuron that functions as a diode and a a second leaky spiking neuron that smoothes an output signal of the first leaky spiking neuron.

9. The processor according to claim 3 wherein the at least one neural network is configured to process the PDM signal to provide an audio process result without calculating Mel-frequency cepstral coefficients.

10. The processor according to claim 1 wherein the detected signal differs from an audio signal.

11. The processor according to claim 1 comprising an interface driver that is located between the sensor and the at least one leaky spiking neuron that is configured to receive the input PDM signal, wherein the interface driver is configured to match between an input impedance of the at least one neural network and an output impedance of the sensor.

12. A method for signal-processing, the method comprises:
    directly receiving, by at least one leaky spiking neuron of at least one neural network directly, an input pulse density modulation (PDM) signal from a sensor; wherein the input PDM signal represents a detected signal that was detected by the sensor; and
    processing, by the at least one neural network, the input PDM signal to provide an indication about the detected input signal.

13. The method according to claim 12 wherein the sensor is an audio sensor and the detected signal is an audio signal.

14. The method according to claim 13 wherein the at least one neural network comprises a first group of leaky spiking neurons wherein the method comprises pre-processing, by the first group of leaky spiking neurons, the PDM signal to provide approximations of output signals of a bank of Mel filters, the approximations represent the detected signal.

15. The method according to claim 14 wherein the at least one neural network comprises a second group of leaky spiking neurons that is coupled to the first group of leaky spiking neurons, and wherein the method comprises processing, by the second group of leaky spiking neurons, the approximations to provide an audio process result.

16. The method according to claim 14 wherein the first group of leaky spiking neurons comprises multiple resonators, wherein the method comprises outputting, by different resonators, approximations of different Mel filters of the bank of MEL filters.

17. The method according to claim 16 wherein the multiple resonators are multiple tunable resonators.

18. The method according to claim 16 wherein each resonator of the multiple resonators comprises a loop of leaky spiking neurons that is followed by a peak detector.

19. The method according to claim 16 wherein the method comprises truncating to zero, by a first leaky spiking neuron of a peak detector, negative output signals of the loop; and smoothing, by a second leaky spiking neuron of the peak detector, an output signal of the first leaky spiking neuron of the peak detector.

20. The method according to claim 14 comprising processing the PDM signal to provide an audio process result without calculating Mel-frequency cepstral coefficients.

21. The method according to claim 12 wherein the detected signal differs from an audio signal.

22. The method according to claim 12 comprising an interface driver that is located between the sensor and the at least one leaky spiking neuron; wherein the method comprises matching, by the interface driver, between an input impedance of the at least one neural network and an output impedance of the sensor.

\* \* \* \* \*